United States Patent
Amend

[11] Patent Number: 5,696,362
[45] Date of Patent: Dec. 9, 1997

[54] WEAK BEAM DETECTION

[75] Inventor: Brian J. Amend, Old Lyme, Conn.

[73] Assignee: Otis Elevator Company, Farmington, Conn.

[21] Appl. No.: 791,430

[22] Filed: Jan. 27, 1997

Related U.S. Application Data

[63] Continuation of Ser. No. 329,027, Oct. 25, 1994, abandoned.

[51] Int. Cl.$^6$ .................................................. B66B 13/20
[52] U.S. Cl. ............................ 187/317; 250/221; 187/392
[58] Field of Search ............................. 250/221, 214; 340/536; 187/316, 317, 392

[56] References Cited

U.S. PATENT DOCUMENTS

| Re. 33,668 | 8/1991 | Grey | 250/3 |
|---|---|---|---|
| 3,746,863 | 7/1973 | Pro ovost | 250/208 |
| 3,805,061 | 4/1974 | Des Rioux De Missimy | 250/209 |
| 3,805,064 | 4/1974 | Kornylak | 250/221 |
| 3,825,745 | 7/1974 | Thomson | 250/208 |
| 3,970,846 | 7/1976 | Schofield et al. | 250/221 |
| 4,063,085 | 12/1977 | Montanvert | 250/221 |
| 4,247,767 | 1/1981 | O'Brien et al. | 250/221 |
| 4,266,124 | 5/1981 | Weber et al. | 250/221 |
| 4,750,591 | 6/1988 | Coste et al. | 187/130 |
| 4,794,248 | 12/1988 | Gray | 250/221 |
| 5,149,921 | 9/1992 | Picado | 187/130 |
| 5,567,931 | 10/1996 | Amend et al. | 250/221 |

FOREIGN PATENT DOCUMENTS

| 3 7 9430 | 12/1982 | Austria. |
| 0 5 44541 | 11/1992 | European Pat. Off.. |
| WO9008092 | 7/1990 | WIPO. |
| WO 82 02787 | 8/1992 | WIPO. |

OTHER PUBLICATIONS

Copy of Austrian Search Report Serial No. 9501604-4 dated Nov. 4, 1996.

Primary Examiner—Robert Nappi

[57] ABSTRACT

An apparatus for detecting weak beams in an beam detection system includes a plurality of emitters for radiating beams of energy, a plurality of detectors for providing detector signals in response to the beams of energy radiated by said plurality of emitters and means for detecting if the beams radiated by said plurality of emitters are weak. If weak beam is detected, the beam is determined inoperative by the obstruction detection system and is not considered in subsequent obstruction detection.

10 Claims, 7 Drawing Sheets

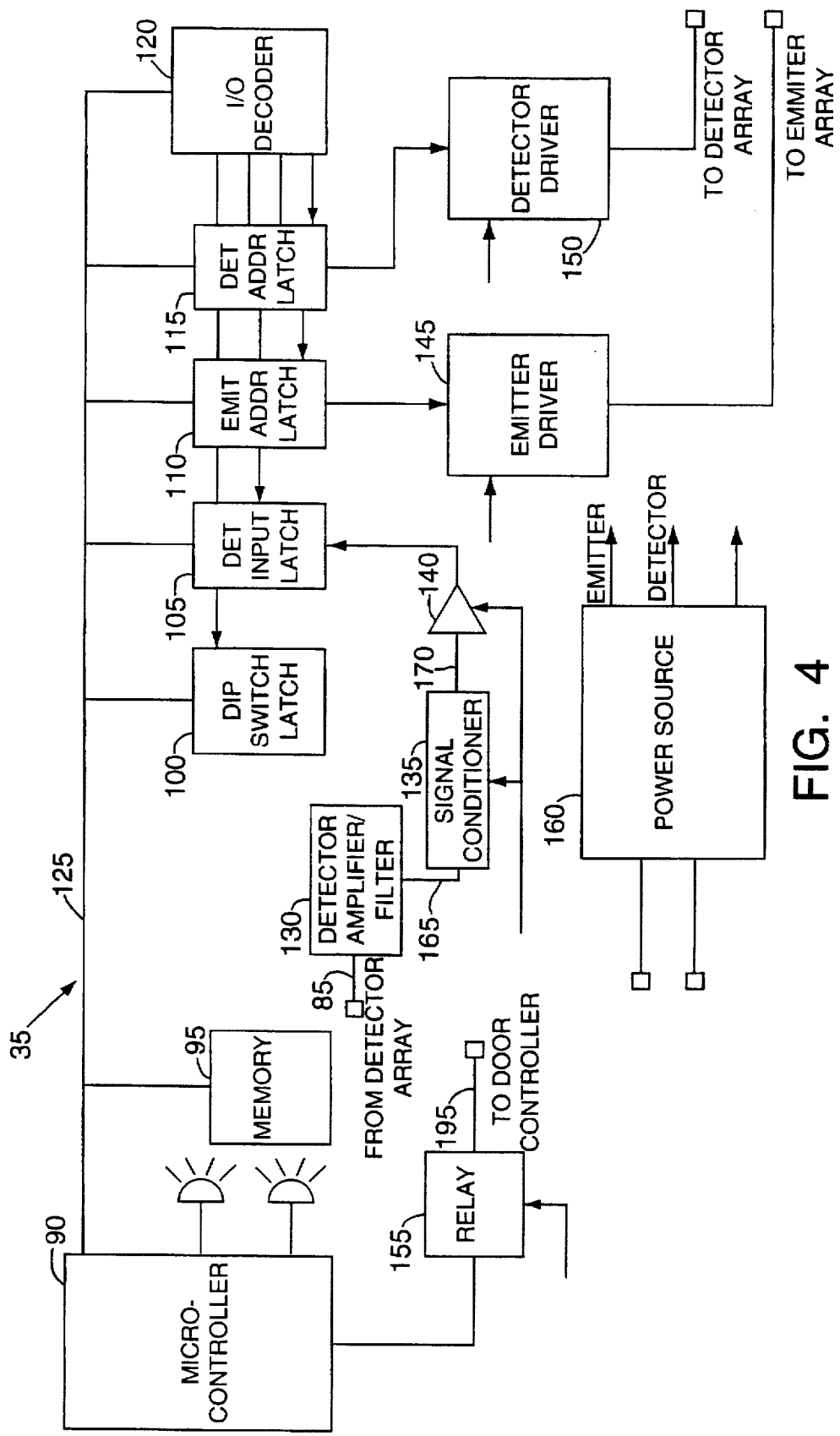

WEAK BEAM DETECTION

This is a file wrapper continuation of co-pending applications Ser. No. 8/329,027 filed on Oct. 25, 1994 now abandoned.

BACKGROUND OF THE INVENTION

1. Technical Field

The present invention relates to detectors in elevators and, more particularly, to the detection of obstructions in an elevator car doorway.

2. Background Art

In elevators, it is common to use one or more automatic sliding doors. Systems are used to detect the presence of an obstruction within the door opening before and during closure for the protection of the passengers. If the system detects an obstruction, the elevator doors are prevented from closing further and preferably are reopened.

One known system for detecting obstructions in the path of elevator doors places light beams in a path across the door opening and uses a sensor to detect an interruption of the light beams, which occurs if an obstruction is disposed within the door opening. Upon sensing the interruption, the sensor issues a signal to alter the motion of the doors, and preferably reopen them.

The system has an array of light emitters disposed vertically on one side of the door, producing light beams, and a corresponding array of photo-sensitive detectors arranged on the other door, for sensing those light beams, thus creating a system which can sense obstructions at different heights in the doorway. The emitters and detectors are disposed on the doors such that if the doors are open then the emitters and detectors are far apart and if the doors are closed, or closing, the emitters and detectors are in close proximity. The emitter and detectors may be subject to degradation such that when they are far apart with respect to each other the energy radiated by the emitter may not be detected by the detector.

DISCLOSURE OF INVENTION

It is an object of the present invention to improved detection of obstructions within a defined area such as in an elevator car doorway.

It is a further object of the present invention to provide a more robust obstruction detection system.

It is another object to provide an improved obstruction detection system such that the number of incidents of elevator doors striking passengers may be reduced.

According to the present invention, an apparatus for detecting weak beams includes a plurality of emitters for radiating beams of energy, a plurality of detectors for detecting the beams of energy radiated by said plurality of emitters and means for determining if the beams radiated by said plurality of emitters are weak.

Among the advantages of the present invention are improved detection of obstructions within a defined area such as in an elevator car doorway and improved detection of obstructions by providing more robust obstruction detection.

BRIEF DESCRIPTION OF THE DRAWINGS

The foregoing and other objects, features and advantages of the present invention will become more apparent in light of the following detailed description and accompanying drawings where:

FIG. 4 is a block diagram of a preferred controller;

BEST MODE FOR CARRYING OUT THE INVENTION

Figure 1:
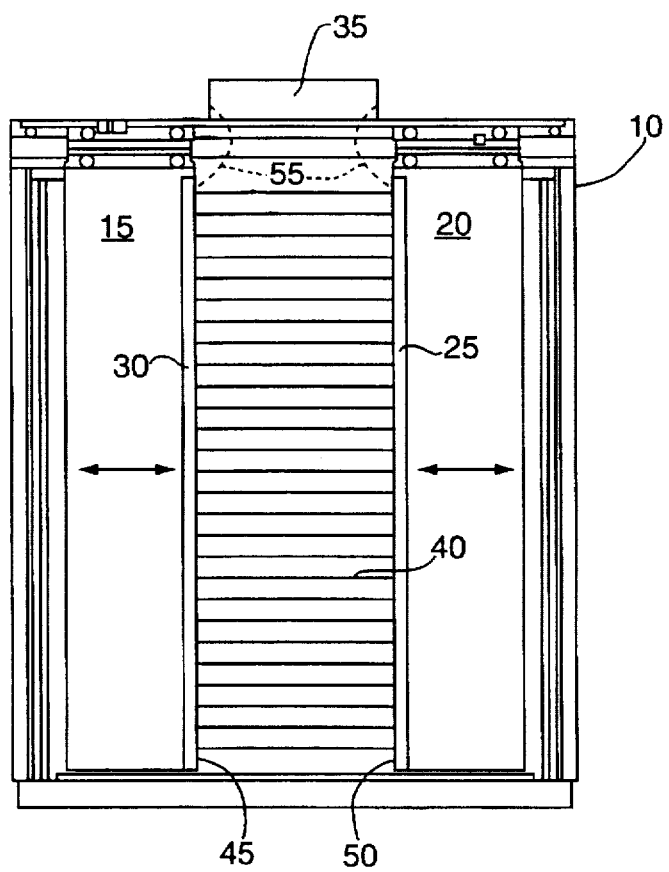
FIG. 1 is a front view of an elevator doorway employing a preferred embodiment of the present invention.

In FIG. 1, an elevator car 10, a first elevator door 15, a second elevator door 20, an emitter array 25, a detector array 30, a controller 35, and a plurality of energy beams 40 are shown. The doors 15,20, shown in an open position, slide to open and close such that as the doors close the closure edge 45 of the door 15 touches the closure edge 50 of the door 20.

The emitter array 25 is shown disposed near the first door 20 and the detector array 30 is shown disposed near the second door 15. The controller 35 is disposed on top of the elevator car 10 and is electrically connected 55 to both the emitter array 25 and the detector array 30. The electrical connection 55 allows the controller 35 to communicate with the emitter array 25 and the detector array 30.

Figure 2:
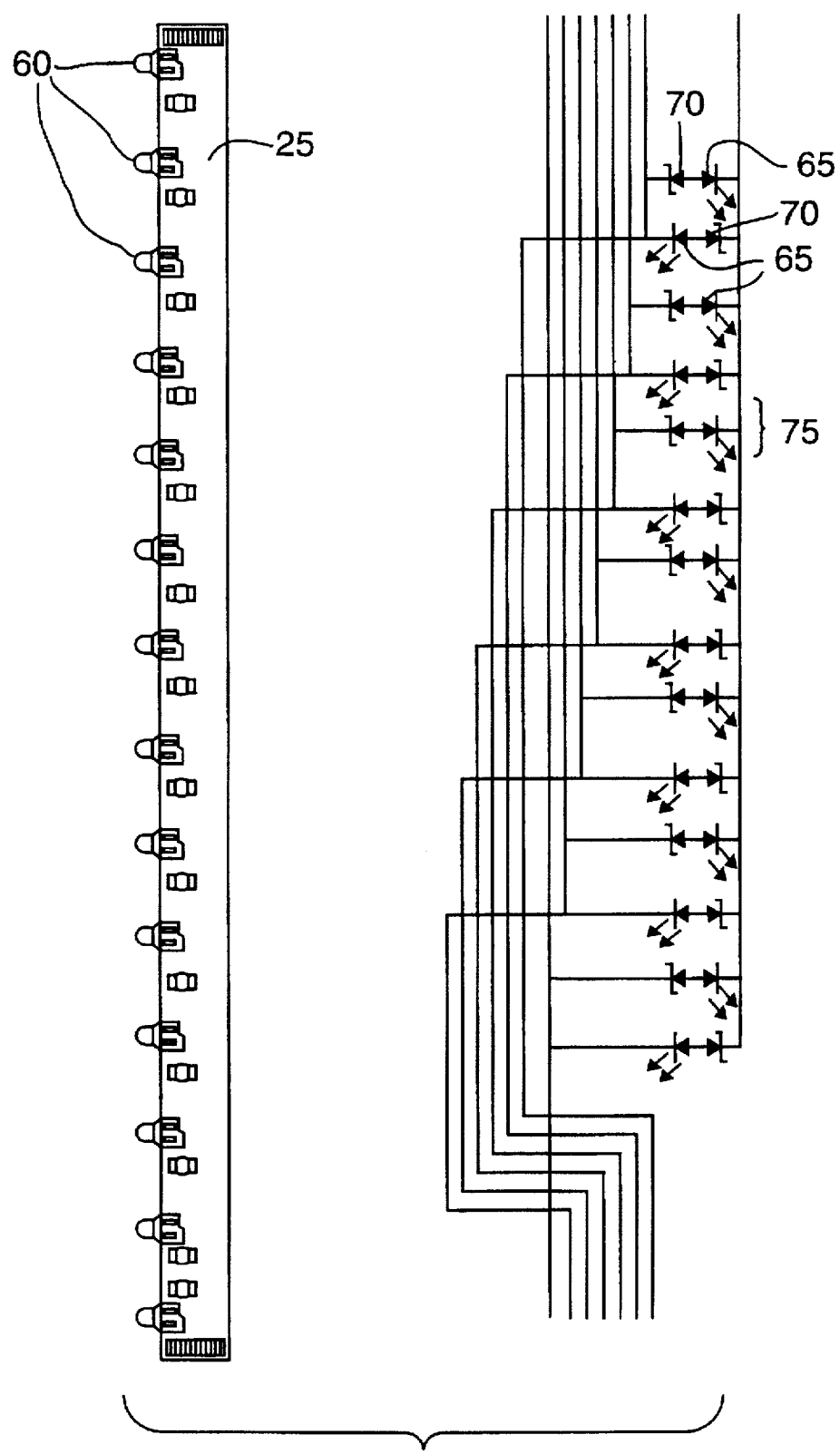
FIG. 2 shows a side view of an emitter array and shows a schematic representation of a preferred embodiment of an emitter array circuitry.

Referring to FIG. 2, the emitter array 25 includes a plurality of emitters 60. The emitters 60 are light bulbs, LED devices or any radiation emitting device; for example, an infrared emitter that is modulated so that its radiated energy is distinguishable from background radiation of the surroundings. In one preferred embodiment, as shown in FIG. 2, each emitter is a LED device 65 which is arranged in series with a zener diode 70 such that a LED/diode pair 75 is created. Each LED/diode pair 75 is electrically connected in parallel with another pair arranged with the opposite polarity such that either pair 75 may be selected, depending on the direction of current flow, using the same electrical connections. This configuration results in reduced manufacturing costs by reducing the required number of wires and connections. In one preferred embodiment, the emitter array includes 56 emitters 60.

Figure 3:
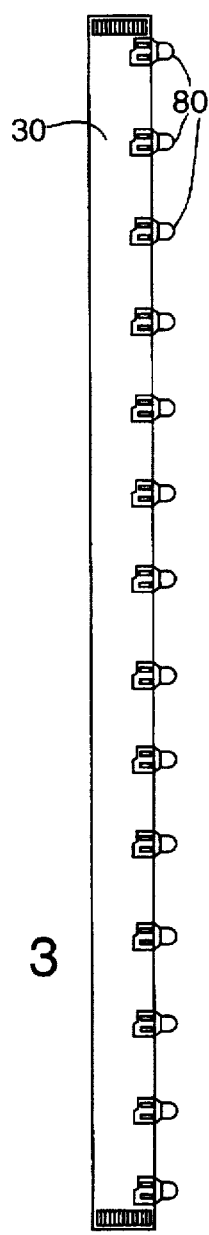
FIG. 3 shows a side view detector array.

Referring to FIG. 3, the detector array 30 includes a plurality of detectors 80. The detectors 80 are any device that is sensitive to the radiation of the emitters 60; yet preferably adapted to be insensitive to radiation other than that from the emitters. For example, the detectors 80 may be photodiodes or phototransistors which are designed to pass signals at the emitter modulation frequency and wavelength.

In one preferred embodiment, for each emitter 60 in the emitter array 25 there is a corresponding detector 80 in the detector array 30 so that matched pairs are formed. Each detector 80 produces a detector signal 85 (shown in FIG. 4) in response to the energy radiated by its corresponding emitter 60 in its matched pair. The detector signal 85 is an analog representation of the magnitude of the radiated energy detected by the detector 80. In this preferred embodiment, only one matched pair is actuated at any one time so that cross interference between emitters 60 is eliminated.

Referring to FIG. 4, the controller 35 includes a microcontroller 90, a memory 95, a dip switch latch 100, a det input latch 105, a emit addr latch 110, a det addr latch 115, an I/O decoder 120, an address/data bus 125, a detector amplifier/filter 130, a signal conditioner 135, an A/D converter 140, an emitter driver 145, a detector driver 150, a relay 155 and a power supply 160.

The microcontroller 90 is a device used to implement control functions, beam detection methods and weak beam detection methods in the present invention as is explained hereinbelow. The memory 95 is used to store data and programs. The address/data bus 125 provides an electrical connection between the microcontroller 90 and the memory 95, the dip switch latch 100, the det input latch 105, the emit addr latch 110, the det addr latch 115 and the I/O decoder 120. A device suitable for use as the microcontroller 90 is commercially available as model 80C31 microcontroller from Intel.

The I/O decoder 120 is a device which enables the microcontroller 90 to transfer data to, and from, the latch devices 100, 105, 110, 115. For example, if the microcontroller 90 requires current data from the det input latch 105, the I/O decoder 120 polls the det input latch and retrieves the current data via the address/data bus. The I/O decoder 120 is electrically connected to the dip switch latch 100, the det input latch 105, the emit addr latch 110, the det addr latch 115 and the microcontroller 90.

The dip switch latch 100 provides a user interface such that dip switch settings can be processed by the controller 35. For example, the user may select a particular system mode by selecting a predetermined dip switch setting. One such system mode is weak beam detection and is explained hereinbelow. The det input latch 105 provides detector data from the detector array 30 to the microcontroller 90. The emit addr latch 110 provides emitter addressing data from the microcontroller 90 to the emitter driver 145. The det addr latch 115 provides detector addressing data from the microcontroller 90 to the detector driver 150. Flip-flops or registers are suitable as latch devices as is well known in the art.

The emitter driver 145 receives emitter address data provided by the microcontroller 90 and actuates the corresponding emitter 60 in the emitter array 25. Likewise, the detector driver 150 receives detector address data provided by the microcontroller 90 and actuates the corresponding detector 80 in the detector array 30. In one preferred embodiment, both the emitter driver 145 and the detector driver 150 are implemented with multiplexers which are respectively responsive to emitter or detector address data and actuate the corresponding emitter 60 or detector 80. This type of addressing technique is well known in the art. Using this arrangement, the microcontroller 90 can actuate the matched pairs in the emitter and detector arrays 25,30. In a preferred embodiment, the microcontroller 90 serially actuates the matched pairs in the order of their physical arrangement. However, the pairs may be activated in any desired order.

Figure 5:
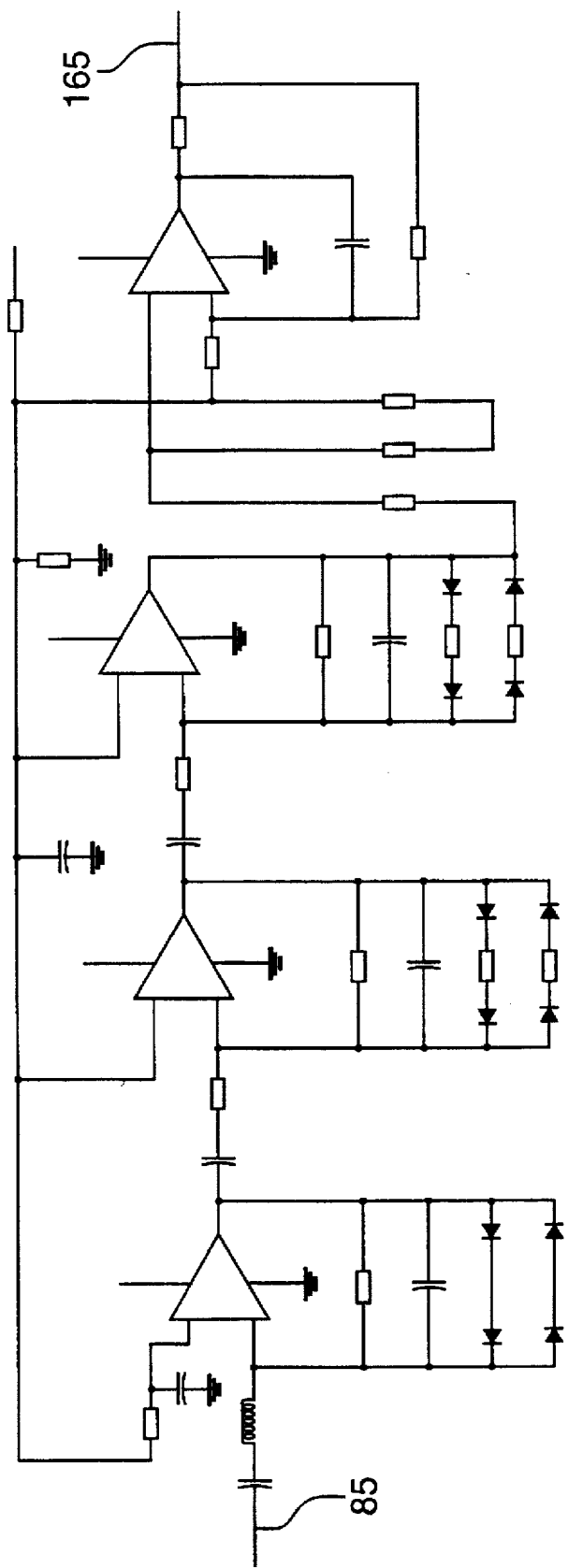
FIG. 5 is a schematic representation of a preferred embodiment of a detector amplifier/filter.

The detector amplifier/filter 130 receives, amplifies and filters the detector signal 85 from each detector 80 such that it provides an amplified/filtered detector signal 165 to the signal conditioner 135. This circuit is used to compensate for the non-linear relationship between radiant intensity and distance by providing non-linear amplification. One preferred embodiment of the detector/filter is shown in FIG. 5.

Figure 6:
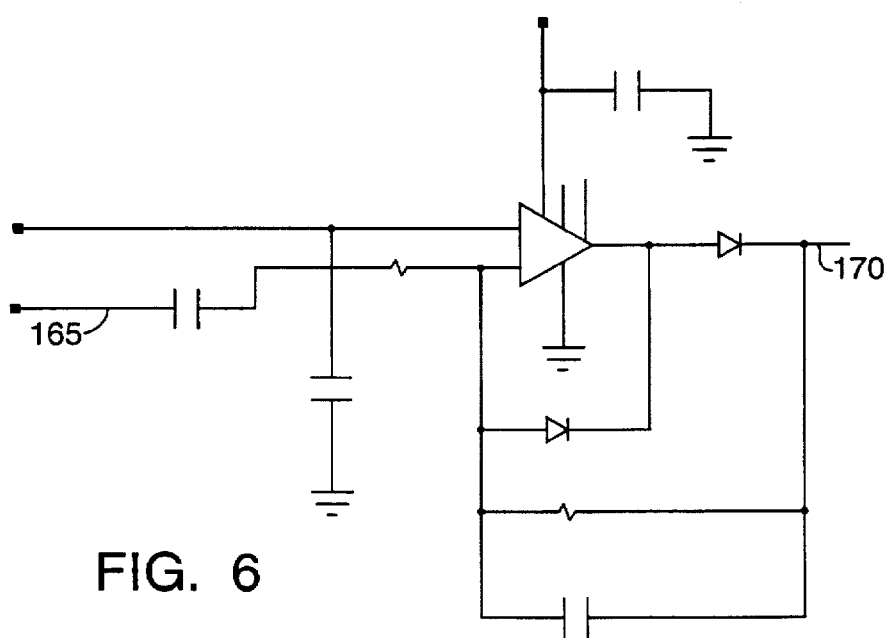
FIG. 6 is a schematic representation of a preferred embodiment of a signal conditioner.

The signal conditioner 135 is a circuit which provides the function of filtering, amplification and rectification and is responsive to the amplified/filtered detector signal 165 such that it provides a conditioned detector signal 170 to the A/D converter 140. Circuits of this type are well known in the art and one preferred embodiment is shown in FIG. 6.

Figure 7:
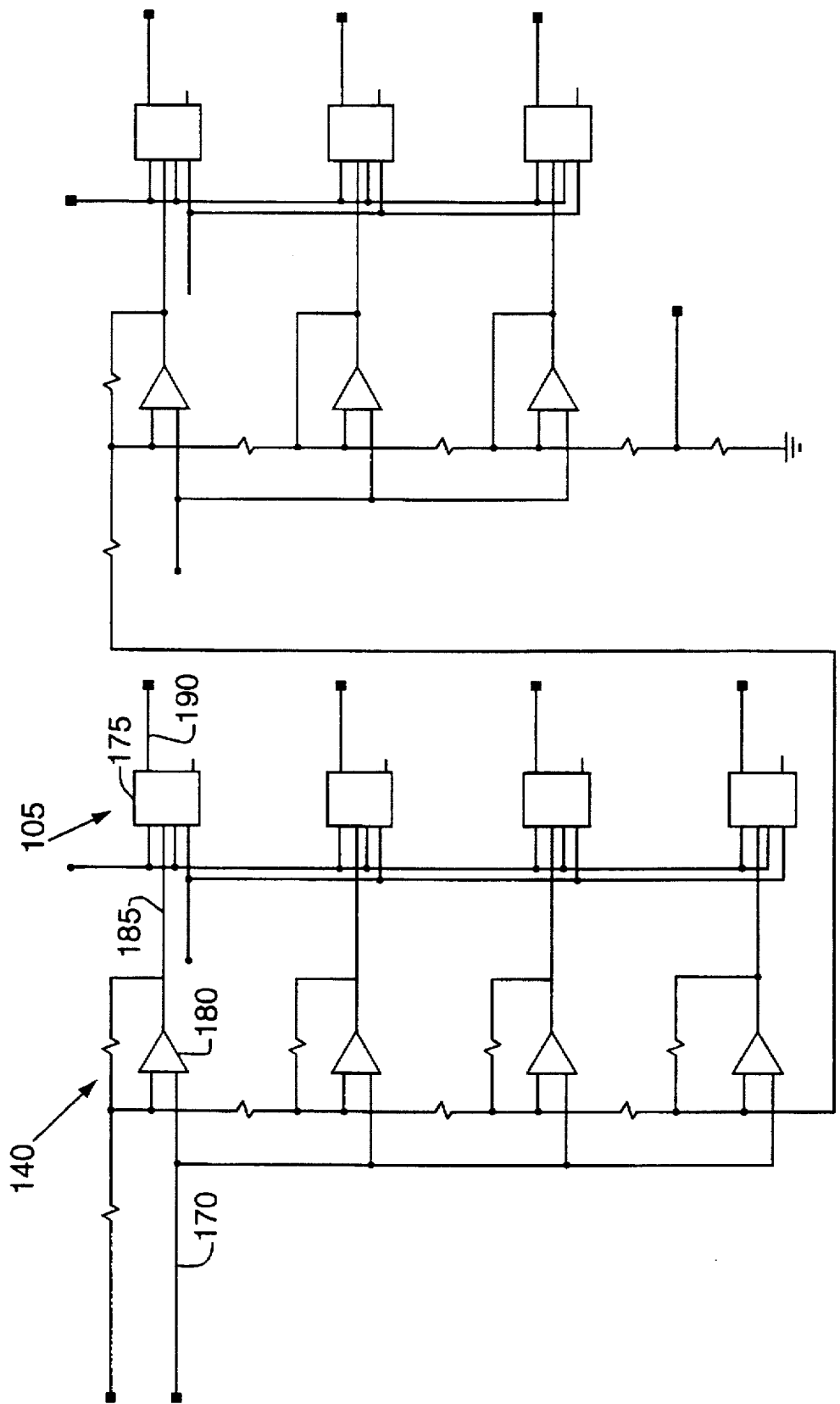
FIG. 7 is a schematic representation of a preferred embodiment of an A/D converter and shows a schematic representation of a preferred embodiment of a det input latch.

Referring to FIG. 7, a schematic diagram of a preferred embodiment of the A/D converter 140 and the det input latch 105 is shown. The det input latch 105 includes seven flip-flops 175. The A/D converter 140 includes seven comparators 180 each having as inputs the conditioned detector signal 170 and a voltage trip point. Each voltage trip point is determined by the VR (voltage reference) signal and location on a voltage driver network. Each comparator 180 respectively provides an output signal 185 which is dependent upon the conditioned detector signal 170 and the voltage trip point. The comparators 180 are connected such that if the magnitude of the conditioned detector signal 170 is greater than the voltage trip point at a particular stage of the network, the comparators 180 at that stage will produce an output signal 185 which clocks the corresponding flip-flop 175 to produce a digital detector signal 190. The microcontroller 90 stores the plurality of digital detector signals 190 in memory 95. The plurality of digital detector signals 190, for a particular emitter 60, collectively represents an integer value ranging from zero to seven and is referred to hereinafter as the digital detector value. The digital detector value of the currently actuated emitter 60 is referred to as the current beam strength ("CBS"). Thus, this circuit arrangement is used to detect the peak value of the conditioned detection signal 170 for each emitter 60 and convert it into a digital format so that the microcontroller 90 can store it in memory 95.

Referring again to FIG. 4, the relay 155 is connected to the microcontroller 90 and the door controller of the elevator system (not shown) and is used to provide a reverse door signal 195 to the door controller if an obstruction is detected.

The power supply 160 is used to supply electric power to the components of the present invention and is well known in the art.

In one preferred embodiment according to the invention, the controller 35 operates in accordance with a weak beam detection method for determining if an energy beam corresponding to a matched pair of the emitter and detector arrays is "weak." This method allows the present invention to provide improved detection of obstructions within a defined area such as in an elevator car doorway by providing the ability to detect a weak beam which may be caused by faulty equipment. A weak beam is a beam which has become either partially obstructed or has degraded. A beam becomes partially obstructed when something, like dust, obscures the emitter and reduces the amount of light radiated. A degraded beam is one which the emitted light intensity is considerably weaker than that for the average beam. Both of these conditions, partially obstructed beams and degraded beams, result in a decreased light intensity, or weak beams. If the detection system fails to detect a weak beam, it may interpret the weak beam as an obstruction so that the elevator doors would continuously open until a nudging mode is triggered. The nudging mode is triggered when the doors remain open beyond a predetermined time and causes the doors to close at a reduced speed and torque. Once the nudging mode is triggered, the elevator doors will attempt to close notwithstanding an obstruction. Thus, weak beam detection also may reduce the number of incidents of elevator doors striking passengers which in turn increases customer satisfaction while decreasing maintenance costs. The weak beam detection method resides in the memory 95 and demonstrates the cooperation of the present invention as is described hereinbelow.

Figure 8:
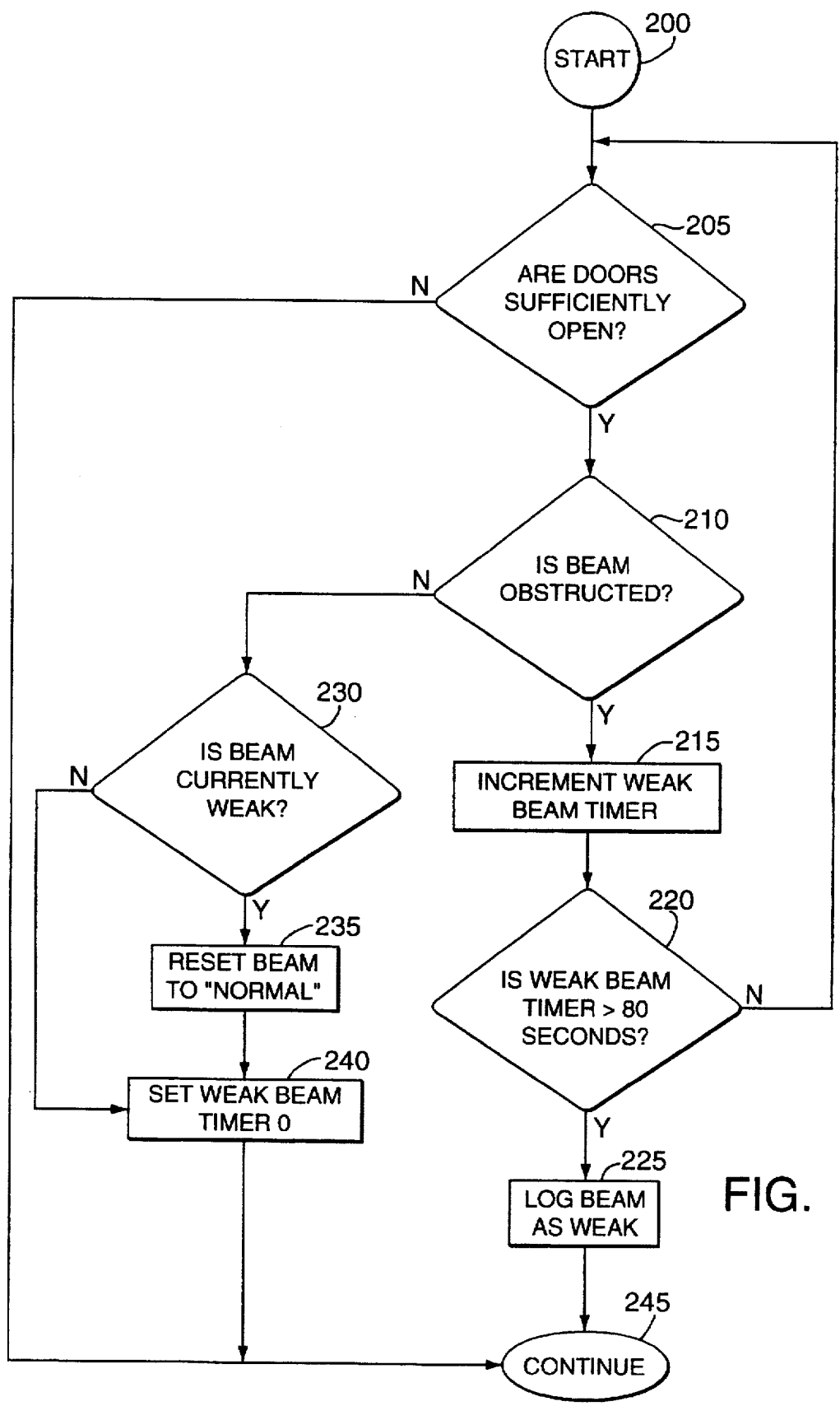
FIG. 8 is a flow diagram of a preferred weak beam detection method embodied in the present invention.

FIG. 8 is a flow diagram of the weak beam method embodied in the present invention. The flow diagram represents a scan of one matched pair of an emitter 60 and a detector 80. Beginning at step 200 labeled "start" the first step performed 205 is to determine if the doors are sufficiently open. To determine if the doors are sufficiently open, the microcontroller 90 generates an average beam strength ("ABS"). To generate the ABS, the microcontroller 90 determines a sum of the digital detector values of the non-obstructed functional beams and divides the sum by the number of non-obstructed functional beams. The ABS will vary as the doors 15,20 travel. For example, the ABS will decrease as the distance between the doors closure edges 45,50 increases. An ABS less than the integer value four represents a sufficiently opened door. If the doors are not sufficiently open, then weak beam detection is not implemented because a weak beam may appear to be normal if the emitter and detector are in close proximity with respect to each other. An ABS integer value of four is chosen as the preferred threshold for determining if the doors are sufficiently open.

If the microcontroller 90 in step 205 determines that the doors are not sufficiently open, then the microcontroller 90 does not employ weak beam detection; instead, the microcontroller 90 moves to step 245 and starts a scan of the next beam. If the microcontroller 90 determines that the doors are sufficiently open, the microcontroller 90 moves to step 210 and determines if the beam is obstructed. In one preferred embodiment according to the invention, the controller 35 operates in accordance with a variable beam detection method for dynamically controlling the detection threshold of an energy beam. The variable beam detection method resides in the memory 95.

Figure 9:
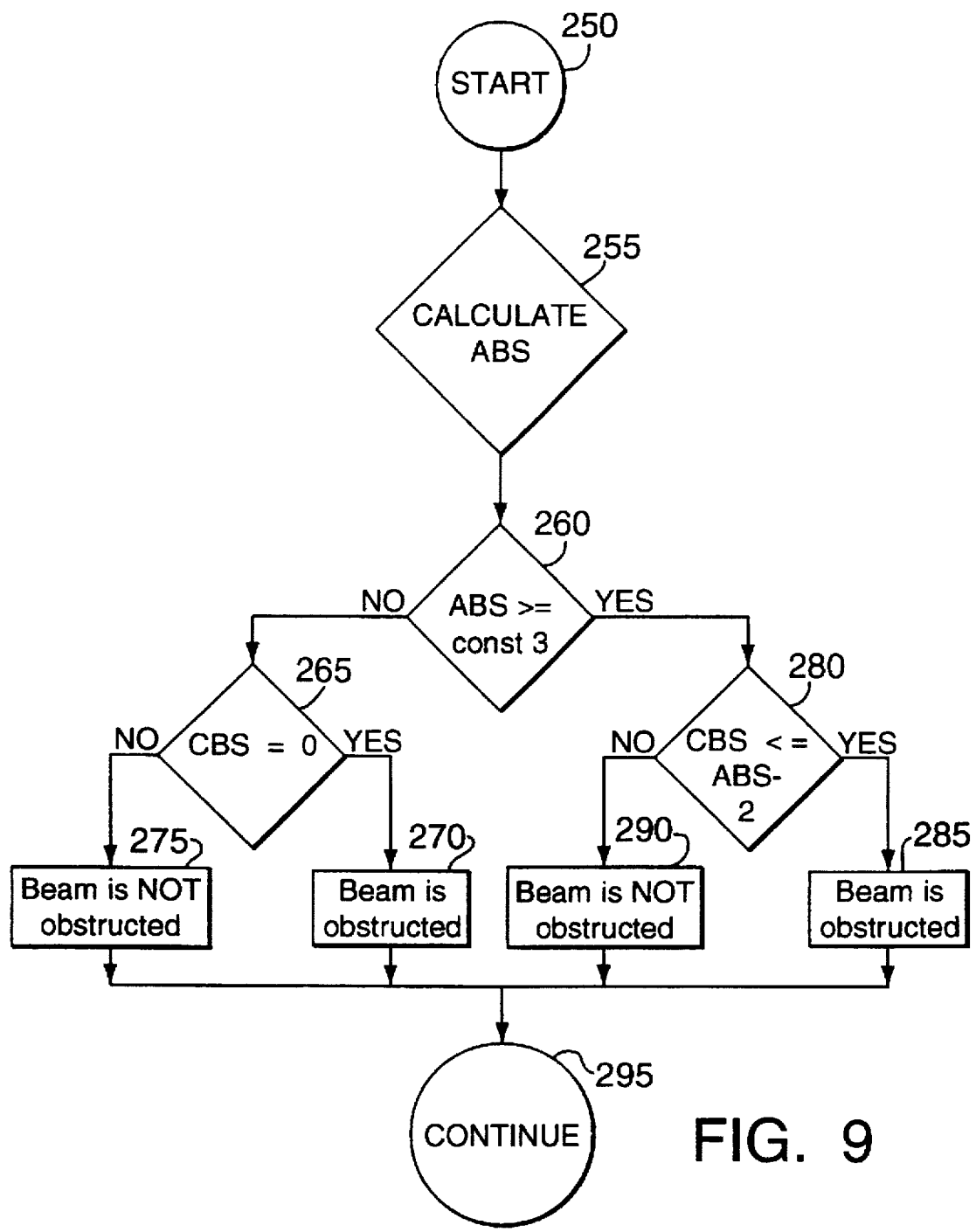
FIG. 9 is a flow diagram of a preferred obstruction detection method embodied in the present invention.

FIG. 9 is a flow diagram of the variable beam method. The flow diagram represents a scan of one matched pair of an emitter 60 and a detector 80. Beginning at step 250 labeled "start" the first step performed 255 is to generate the average beam strength ABS. To generate the ABS, the microcontroller 90 determines the sum of the digital detector values of the non-obstructed functional beams and divides the sum by the number of non-obstructed functional beams. An ABS less than the integer value three represents a large distance between the door closure edges 45,50 where variable beam detection is not critical since at far distances an obstruction can easily block the beam of energy.

A Step 260 is implemented for determining whether the CBS should be compared to a static or a dynamic threshold for detecting the presence of an obstruction. The static detection threshold is a predetermined value against which the CBS is compared for detecting the presence of an obstruction. The dynamic detection threshold is a variable value against which the CBS is compared for detecting the presence of an obstruction. In step 260 the microcontroller 90 compares the ABS to the integer value three. If the ABS is not greater than nor equal to the integer value three, then the present invention implements a static detection threshold of zero. The present invention implements the static detection threshold as follows. In step 265 the microcontroller 90 determines if the CBS is equal to zero. If CBS is equal to zero then the microcontroller 90 determines that the energy beam is obstructed as shown in step 270. If the CBS is not zero then the microcontroller 90 determines that the energy beam is not obstructed as shown in step 275.

If the ABS is greater than or equal to the integer value three, then the present invention implements variable beam detection by using a dynamic detection threshold of ABS minus the integer value two. The present invention implements the dynamic detection threshold as follows. The microcontroller 90 in step 280 determines whether the CBS is less than or equal to the ABS minus the integer value two. If the CBS is less than or equal to the ABS minus the integer value two then the microcontroller 90, in step 285, determines that the current beam is obstructed. If the CBS is not less than nor equal to the ABS minus the integer value two then the microcontroller 90, in step 290, determines that the current beam is not obstructed. The integer value of two represents a predetermined range that permits small deviations from the average beam strength to be ignored so as to avoid detecting false obstructions. Thus, the present invention determines if the CBS has deviated beyond a predetermined range of the ABS. In one preferred embodiment, the ABS is generated every 100 milliseconds whereas the CBS is generated every 35 milliseconds. Thus, a new ABS, step 255, is not generated during each scan of the matched pairs. It should be understood by those skilled in the art that the integer values used in this best mode embodiment result from one specific implementation of the present invention and other values may be chosen without departing from the spirit and scope of the invention. In addition, the variable beam detection method described above is only one specific implementation of detecting obstructions and other methods may be used without departing from the spirit and scope of the present invention. For example, a obstruction detection method which only uses a static detection threshold of zero may be used.

Referring again to FIG. 8, if the microcontroller 90 determines that the beam is obstructed then it increments a weak beam timer for that particular beam in step 215. The weak beam timer is implemented by a program stored in the memory 95. Each beam has an associated weak beam timer which is used to determine how long the beam is obstructed. Each timer is only incremented when the doors are sufficiently open as is explained below. In step 220, the microcontroller 90 determines if the weak beam timer has a value greater than eighty seconds. If the weak beam timer does not have a value greater than eighty seconds then the microcontroller 90 returns to step 205 to scan the next beam. If the weak beam timer does have a value greater than eighty seconds then the beam is logged as weak in step 225. Once a beam is logged as weak it is determined inoperative by the obstruction detection system and is not considered in subsequent obstruction detection. This prevents the obstruction detection system from perceiving the weak beam as an obstruction. Thus, a more robust obstruction detection system is achieved by allowing the system to recover from either from a faulty device or a partial blockage of a beam.

Returning to step 210, if the beam is not obstructed then the microcontroller 90 moves to step 230 and determines if the beam is currently logged as weak. If the beam is currently logged as weak then the microcontroller 90 logs the beam as "normal" in step 235. Then the microcontroller 90 moves to step 240 and resets the beam timer to zero. If the beam is not already logged as weak then the microcontroller 90 moves to step 240 and the beam timer for that beam is reset to zero.

The following is provided as one example of weak beam detection. For the purposes of this example assume that beam three is weak. When the doors become sufficiently open, the weak beam timer is started for beam three. The doors stay open for twenty seconds, which is typically the nudging time, because beam three is registering an apparent obstruction. When the doors close using nudging, the timer is paused because the doors are not in the sufficiently open state. At this time, beam three has a count of twenty seconds on its weak beam timer. At the next elevator landing, the doors open and the weak beam timer for beam three resumes timing. This pattern continues until the weak beam timer reaches eighty seconds, at which point the beam is deemed weak and is taken out of the scan. Should the beam connect at any time when the doors are sufficiently open, the beam would be reinstated.

Thus, the present invention provides improved detection of obstructions within a defined area such as in an elevator car doorway by providing the ability to detect weak beams which may be caused by faulty equipment. The detection of weak beams allows the system to compensate and reduced the number of incidents of elevator doors striking passengers which in turn increases customer satisfaction while decreasing maintenance costs.

Although the invention has been shown and described with respect to a best mode embodiment thereof, it should be understood by those skilled in the art that various other changes, omissions and additions in the form and detail thereof may be made therein without departing from the spirit and scope of the invention.

What is claimed is:

1. An apparatus for detecting an obstruction in an elevator doorway, said apparatus comprising:
   a. a plurality of emitters for radiating beams of energy, said plurality of emitters being disposed near a first elevator door;
   b. a plurality of detectors for detecting the beams of energy radiated by said plurality of emitters, said plurality of detectors being disposed near a second elevator door; and
   c. a controller electrically connected to said plurality of emitters and said plurality of detectors, said controller determines an average beam strength for the beams of energy radiated by said plurality of emitters; wherein,
   if the first elevator door and the second elevator door are sufficiently open such that the average beam strength is below a determined threshold said controller determines if the beams are weak.

2. An apparatus as recited in claim 1 wherein said means implements a weak beam timer for each beam radiated by said plurality of emitters.

3. An apparatus as recited in claim 1 wherein the beams of energy radiated by said plurality of emitters are beams of light.

4. A weak beam detection apparatus for detection of weak beams, said apparatus comprising:
   a. a plurality of emitters for radiating beams of energy;
   b. a plurality of detectors for detecting the beams of energy radiated by said plurality of emitters; and
   c. a controller electrically connected to said plurality of emitters and said plurality of detectors, said controller determines an average beam strength for the beams of energy radiated by said plurality of emitters; wherein,
   if said plurality of emitters and said plurality of detectors are sufficiently apart with respect to each other such that the average beam strength is below a determined threshold said controller determines if the beams are weak.

5. A weak beam detection apparatus as recited in claim 4 wherein said means implements a weak beam timer for each beam radiated by said plurality of emitters.

6. A weak beam detection apparatus as recited in claim 4 wherein the beams of energy radiated by said plurality of emitters are beams of light.

7. A method for weak beam detection comprising the steps of:
   a. emitting a plurality of beams of energy;
   b. detecting the plurality of beams of energy;
   c. determining an average beam strength of the beams of energy:
   d. determining if the average beam strength is below a determined threshold; and
   e. determining if in a beam of energy in the plurality of beams of energy is weak in response to determining that the average beam strength is below the determined threshold.

8. A method for weak beam detection as recited in claim 7 wherein said determining step comprises implementing a weak beam timer for each beam of the plurality of beams emitted in said emitting step.

9. A method for weak beam detection as recited in claim 7 wherein said method further comprises the step of determining weak beams as inoperative.

10. A method for weak beam detection as recited in claim 7 wherein said method is used with an obstruction detection system for detecting obstructions in a defined area.

* * * * *